(12) United States Patent  
Moy et al.

(10) Patent No.: US 9,193,479 B2  
(45) Date of Patent: Nov. 24, 2015

(54) MONITORING OF HIGH-LIFT SYSTEMS FOR AIRCRAFT

(71) Applicant: The Boeing Company, Chicago, IL (US)

(72) Inventors: George Moy, Seattle, WA (US); Peter A. Padilla, Mill Creek, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/668,911

(22) Filed: Mar. 25, 2015

(65) Prior Publication Data

US 2015/0197347 A1  Jul. 16, 2015

Related U.S. Application Data

(62) Division of application No. 13/852,828, filed on Mar. 28, 2013, now Pat. No. 9,073,643.

(51) Int. Cl.
*B64D 45/00* (2006.01)
*B64C 13/50* (2006.01)
*G01R 19/165* (2006.01)

(52) U.S. Cl.
CPC ............ *B64D 45/0005* (2013.01); *B64C 13/50* (2013.01); *G01R 19/1659* (2013.01); *B64D 2045/001* (2013.01)

(58) Field of Classification Search
CPC ..................... B64D 45/0005; B64D 2045/001; G01R 19/1659; B64C 13/50
USPC .......................................................... 701/33.9
See application file for complete search history.

(56) References Cited

U.S. PATENT DOCUMENTS

2010/0100355 A1   4/2010  Marx et al.
2013/0261852 A1*  10/2013  Recksiek et al. .................. 701/3

* cited by examiner

*Primary Examiner* — Mary Cheung
*Assistant Examiner* — Anne Mazzara
(74) *Attorney, Agent, or Firm* — Duft Bornsen & Fettig LLP

(57) ABSTRACT

Monitoring of high-lift systems for aircraft. In one configuration, a method for monitoring a high-lift system includes monitoring a first current draw of a first drive station of the high-lift system, and monitoring a second current draw of a second drive station of the high-lift system. The method further includes comparing the first current draw and the second current draw to determine if a differential between the first current draw and the second current draw exceeds a threshold, and generating a failure signal if the differential between the first current draw and the second current draw exceeds the threshold.

20 Claims, 11 Drawing Sheets

MONITORING OF HIGH-LIFT SYSTEMS FOR AIRCRAFT

RELATED APPLICATIONS

This patent application is a divisional of co-pending U.S. non-provisional patent application Ser. No. 13/852,828, filed on Mar. 28, 2013, which is hereby incorporated by reference.

FIELD

This disclosure relates to the field of high-lift systems for fixed-wing aircraft.

BACKGROUND

High-lift systems are utilized on the wings of aircraft to increase lift or drag during take-offs and landings. One type of high-lift system uses flaps on the trailing edge of the wings. The flaps are moveable surfaces that may be extended during take-offs and landings, and retracted at cruising speeds.

There are a variety of actuation systems used to extend and retract trailing-edge flaps on a wing. One particular type of actuation system uses a drive station on each side of the flap. When a drive station is installed on either side of a flap with no mechanical interaction between the drive stations, this type of actuation system is referred to as a "distributed" actuation system. A drive station includes a motor, a gear train, and a drive screw that connects to the flap through an actuator arm. The motor (e.g., an electric motor) in a drive station turns the drive screw in a forward or reverse direction through the gear train. The drive screw converts the rotation motion of the motor and gear train into a linear motion to impart movement on the actuator arm. As the actuator arm is pushed or pulled by the drive screw, the flap connected to the actuator arm is extended or retracted. It is also possible to have an actuator arrangement in a rotary configuration with a rotary output rather than a linear output.

A mechanical malfunction may occur when the drive station on one side of the flap becomes disconnected and is no longer able to impart movement on the flap. After this failure occurs, the drive station on one side of the flap would bear the full load of holding the flap in the selected position. For example, when the aircraft is taking off or landing, the flaps are held at selected positions (e.g., fully extended or partially extended) to increase drag or lift. When the flap is being held in position by one side, the flap can actually twist when under sufficient airloads. This condition is referred to as a "freewheeling skew" failure.

If the flap is actively being extended or retracted when the malfunction occurs (e.g. a jam or a disconnect within the drive station), then the flap will be driven from only one side which can cause the flap to twist. This condition is referred to as a "powered skew" failure. Both of these failure conditions can damage the high-lift system of the aircraft.

SUMMARY

Configurations described herein provide systems and methods for monitoring high-lift systems for failures. In one configuration, a method includes monitoring a first current draw of a first drive station of the high-lift system, and monitoring a second current draw of a second drive station of the high-lift system. The method further includes comparing the first current draw and the second current draw to determine if a differential between the first current draw and the second current draw exceeds a threshold, and generating a failure signal if the differential between the first current draw and the second current draw exceeds the threshold. The first drive station and the second drive station may be on opposing sides of the aircraft, or on the same flap. This method allows for detection of freewheeling skew failures.

Another configuration comprises a method of monitoring a high-lift system on an aircraft having a first drive station installed on a first side of a flap and a second drive station installed on a second side of the flap. The method includes monitoring a current draw of the first drive station for actuating the flap, identifying an expected current draw of the drive station, and comparing the monitored current draw of the first drive station to the expected current draw to determine if a differential between the monitored current draw and the expected current draw exceeds a threshold. If the differential exceeds the threshold, then the method includes generating a failure signal. This method allows for detection of powered skew failures.

Another configuration comprises a method of monitoring a high-lift system of an aircraft. The method includes monitoring a motor position of a motor in a drive station for actuating a flap, and calculating a position of the flap based on the motor position. The method further includes monitoring a position sensor in the drive station to determine an actual position of the flap. The method further includes comparing the actual position of the flap and the calculated position of the flap to determine if a differential between the actual position and the calculated position exceeds a threshold, and generating a failure signal if the differential exceeds the threshold. This method allows for detection of powered skew failures.

The features, functions, and advantages that have been discussed can be achieved independently in various configurations or may be combined in yet other configurations further details of which can be seen with reference to the following description and drawings.

DESCRIPTION OF THE DRAWINGS

Some configurations of the present disclosure are now described, by way of example only, and with reference to the accompanying drawings. The same reference number represents the same element or the same type of element on all drawings.

DESCRIPTION

The figures and the following description illustrate specific exemplary configurations. It will thus be appreciated that those skilled in the art will be able to devise various arrangements that, although not explicitly described or shown herein, embody the principles described herein and are included within the contemplated scope of the claims that follow this description. Furthermore, any examples described herein are intended to aid in understanding the principles of the disclosure, and are to be construed as being without limitation. As a result, this disclosure is not limited to the specific configurations or examples described below, but by the claims and their equivalents.

Figure 1:
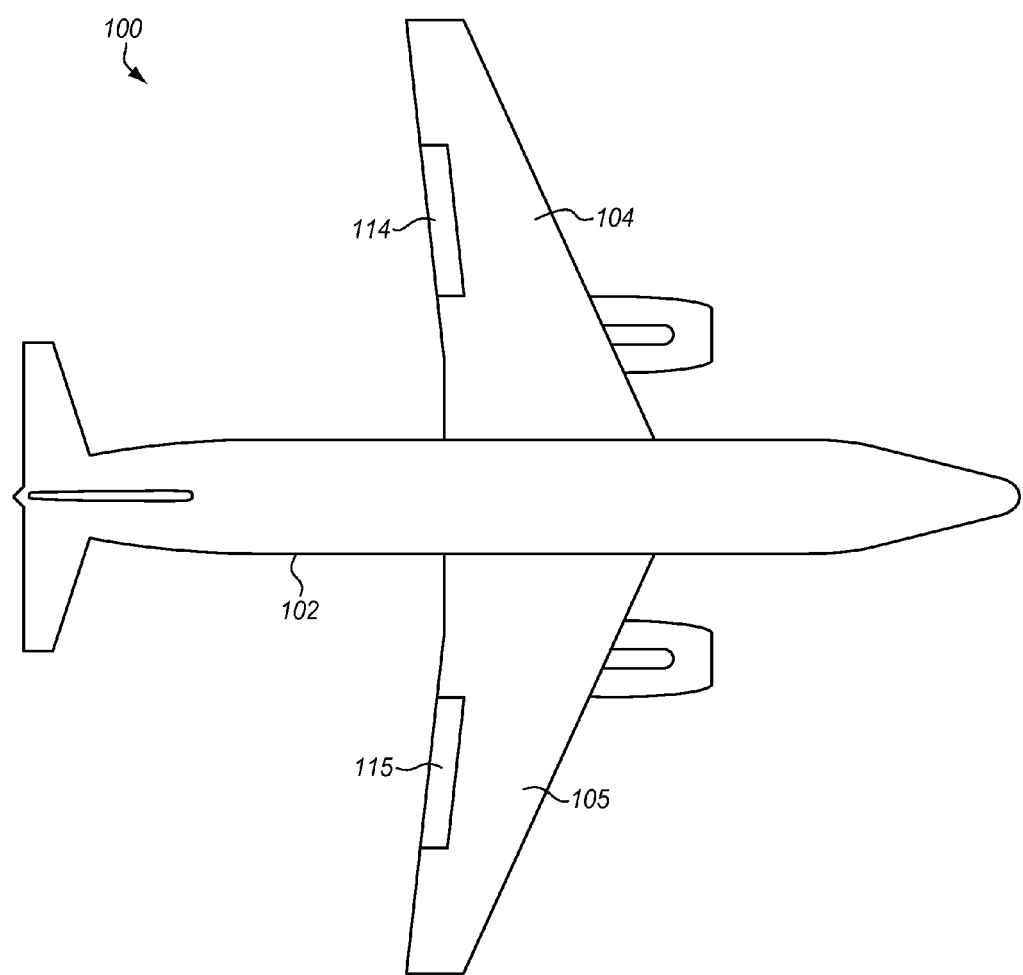
FIG. 1 is a top view of an aircraft in an exemplary configuration.

FIG. 1 is a top view of an aircraft 100 in an exemplary configuration. Aircraft 100 includes an elongated fuselage 102 having wings 104-105 on the left and right sides of the fuselage 102, respectively. Wings 104-105 each have an extendable flap 114-115 that is able to increase drag or lift when extended from a trailing edge of the wing. Flaps 114-115 are part of a high-lift system implemented in aircraft 100. Although one flap is illustrated on each wing 104-105, those skilled in the art understand that multiple flaps may be installed on each of the wings 104-105.

Figure 2:
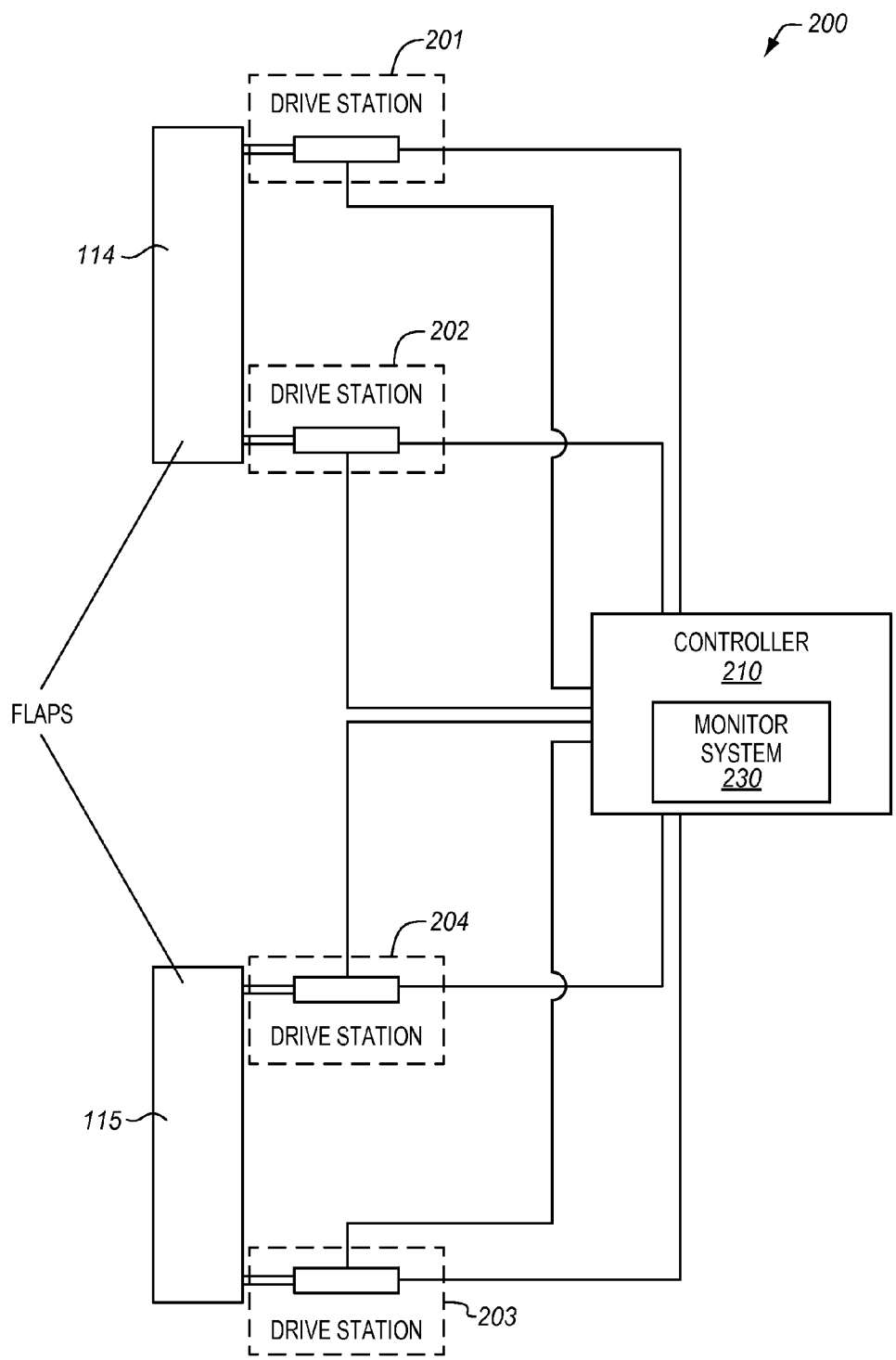
FIG. 2 is a schematic diagram of a high-lift system of an aircraft in an exemplary configuration.

The configurations described herein provide systems and methods for monitoring the high-lift system of aircraft 100 to identify failures, such as a freewheeling skew failure or a powered skew failure. FIG. 2 is a schematic diagram of a high-lift system 200 of aircraft 100 in an exemplary configuration. High-lift system 200 includes flaps 114-115 that are attached to wings 104-105, respectively (see also FIG. 1). A drive station is installed on each side of flaps 114-115. For instance, drive station 201 is installed on an outboard side of flap 114, and drive station 202 is installed on an inboard side of flap 114. Drive station 203 is installed on an outboard side of flap 115, and drive station 204 is installed on an inboard side of flap 115. Because a drive station is installed on each side of flaps 114-115 with no mechanical interaction between the drive stations, the actuation configuration of high-lift system 200 is considered "distributed" in these configurations.

High-lift system 200 includes a high-lift controller 210 that is in communication with drive stations 201-204. Controller 210 controls the overall operation of high-lift system 200 to extend or retract flaps 114-115 responsive to input from a pilot, a flight control system, etc. Controller 210 is able to provide electrical power to each of drive stations 201-204 to actuate the drive stations (electrical power can also be supplied by the aircraft electrical power system). The drive stations 201-204 used herein are electrically controlled, and therefore may be referred to as Electrical-Mechanical Actuators (EMA). Controller 210 is also able to monitor the operation of the drive stations 201-204 through one or more sensors integrated within the drive stations 201-204.

Figure 3:
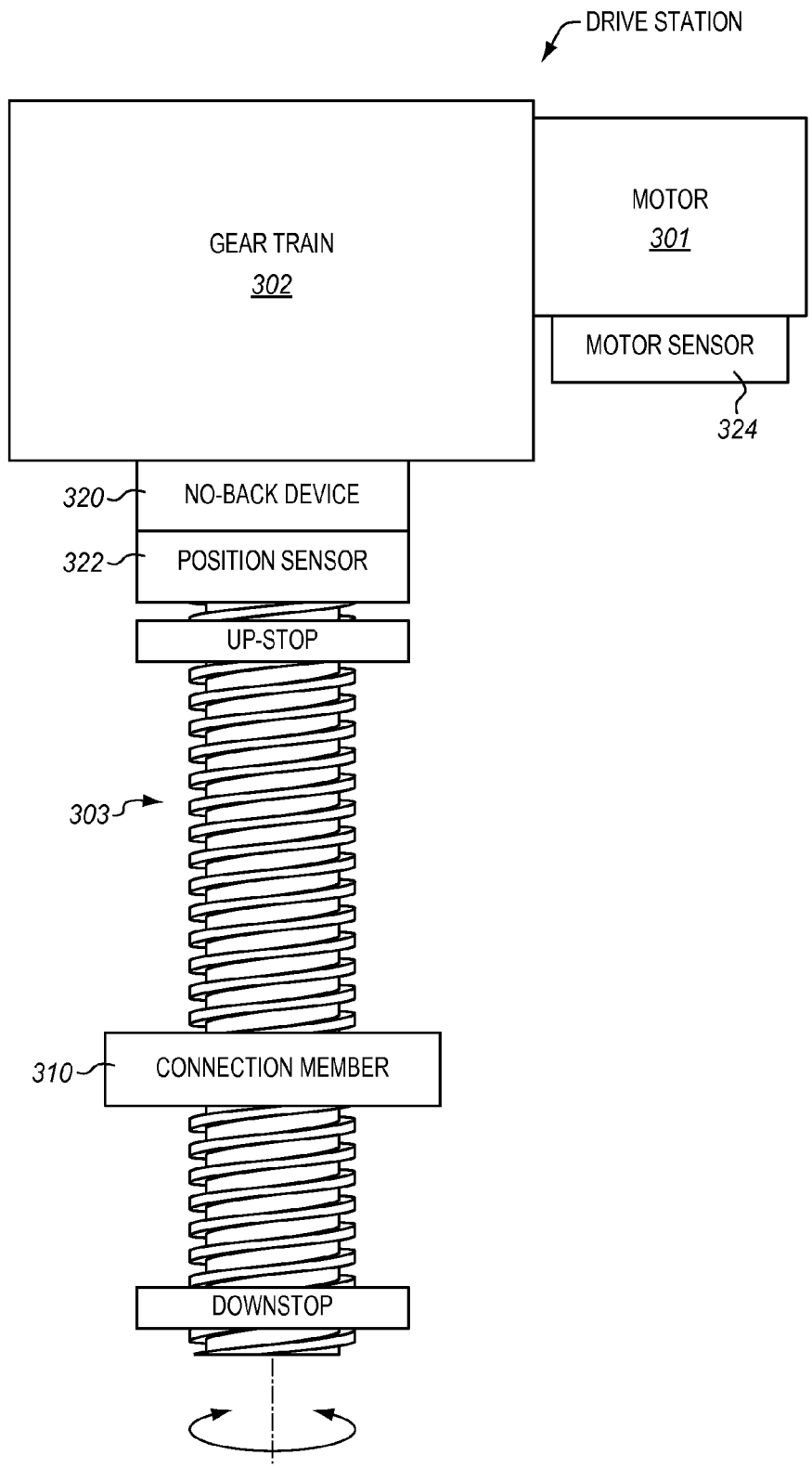
FIG. 3 illustrates a drive station in an exemplary configuration.

FIG. 3 illustrates a drive station in an exemplary configuration. The drive station in FIG. 3 may represent the structure of drive stations 201-204 as in FIG. 2. In this configuration, the drive station includes an electric motor 301, a gear train 302, and a drive screw 303. Motor 301 is able to turn clockwise or counterclockwise in response to the signals from controller 210. The rotational motion of motor 301 turns a series of gears within gear train 302, which is typically used to slow down the rotational motion of motor 301. Gear train 302 in turn imparts rotational motion on drive screw 303.

Drive screw 303 includes a connection member 310, such as a ball nut and gimbal, that moves upward or downward along drive screw 303 in FIG. 3 as drive screw 303 turns. Therefore, drive screw 303 converts the rotation motion of motor 301 and gear train 302 into a linear motion of connection member 310. Although not shown in FIG. 3, connection member 310 is configured to attach to one end of an actuator arm (not shown), while the other end of the actuator arm connects to a side of a flap. Thus, when connection member 310 moves up and down on drive screw 303, this motion imparts movement on the actuator arm to extend or retract the flap.

The drive station in FIG. 3 further includes a "no-back" device 320. No-back device 320 acts as a brake to ensure irreversibility of the flap if the drive station becomes disconnected from the flap. For example, if there were a failure in motor 301, then no-back device 320 would engage to stop the flap from moving.

The drive station in FIG. 3 further includes an integrated position sensor 322. Position sensor 322 is installed between no-back device 320 and the flap, and monitors an output position of the drive station (e.g., the rotation angle of drive screw 303). Position sensor 322 may alternatively be installed at connection member 310, and/or directly attached to the flap. The position sensor 322 in FIG. 3 is a preferred location because it incorporates the sensor into the drive station, which reduces installation time and maintenance costs.

The drive station in FIG. 3 further includes a motor sensor package 324. Motor sensor package 324 is able to monitor a current draw or load on motor 301. Motor sensor package 324 is also able to monitor a position of motor 301. The position of motor 301 may be indicated by a number of turns in either a forward or reverse direction with a hall effect or a rotary type sensor. This type of sensor is inherently used to control a brushless DC-type motor, and can also be used to sense motor rotations and motor position.

In FIG. 2, the controller 210 of high-lift system 200 further includes a monitor system 230. Monitor system 230 is communicatively coupled to drive stations 201-204, and sensors within drive stations 201-204, such as position sensor 322 and/or motor sensor package 324. Monitor system 230 is configured to monitor the operation of high-lift system 200 to detect failures.

The first type of failure detectable by monitor system 230 is a freewheeling skew failure. A freewheeling skew failure may occur when a flap 114-115 is being held by only one of the two drive stations.

Figure 4:
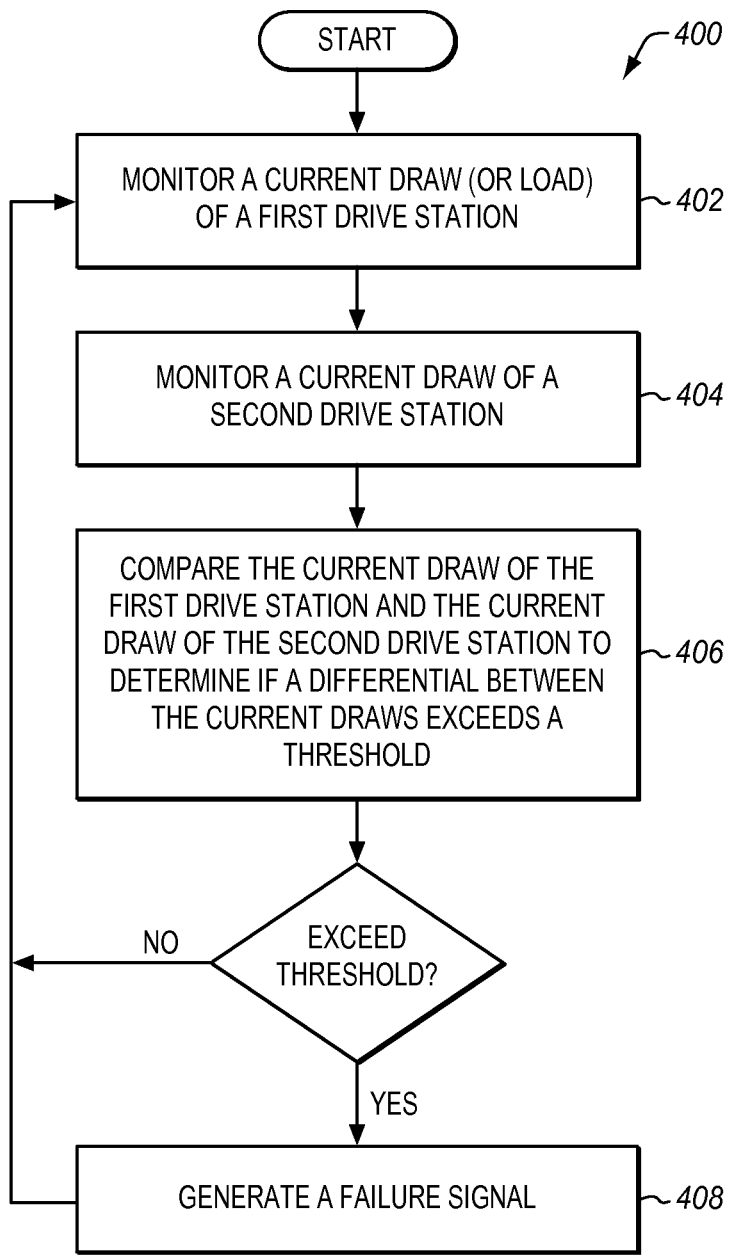
FIG. 4 is a flow chart illustrating a method of monitoring a high-lift system for a freewheeling skew failure in an exemplary configuration.

FIG. 4 is a flow chart illustrating a method 400 of monitoring high-lift system 200 for a freewheeling skew failure in an exemplary configuration. The steps of method 400 will be described with respect to monitor system 230 of FIG. 2, although one skilled in the art will understand that the methods described herein may be performed by other devices or systems not shown. The steps of the methods described herein are not all inclusive and may include other steps not shown. The steps for the flow charts shown herein may also be performed in an alternative order.

For method 400, monitor system 230 compares the current draw from two drive stations of high-lift system 200. For instance, in step 402, monitor system 230 monitors a current draw (or load) of a first drive station. To monitor a current draw of a drive station, monitor system 230 may receive a signal from motor sensor package 324 indicating the current draw for motor 301 at any given time (see FIG. 3). In step 404, monitor system 230 monitors a current draw of a second drive station.

Monitor system 230 then compares the current draw of the first drive station and the current draw of the second drive station to determine if a differential between the current draws exceeds a threshold (step 406). The results of the comparison in step 406 may be filtered to avoid inadvertent faults due to transients caused by airplane maneuvering or other upsets. Monitor system 230 then generates a failure signal in step 408 if the differential exceeds the threshold. The failure signal is generated subject to any filtering or delays used to ensure that a failure is detected as opposed to transients caused by airplane maneuvering or other upsets.

The method in FIG. 4 allows monitor system 230 to detect a condition for a freewheeling skew failure. When the current draw of two drive stations differs by more than a threshold amount, this condition indicates that one of the drive stations has become disconnected from the flap. Because the drive station is disconnected, the flap will only be held in place by the drive station on the other side of the flap, which can cause a freewheeling skew failure. Method 400 may compare current draws from different sets of drive stations within high-lift system 200, which is further illustrated in FIGS. 5-7.

Figure 5:
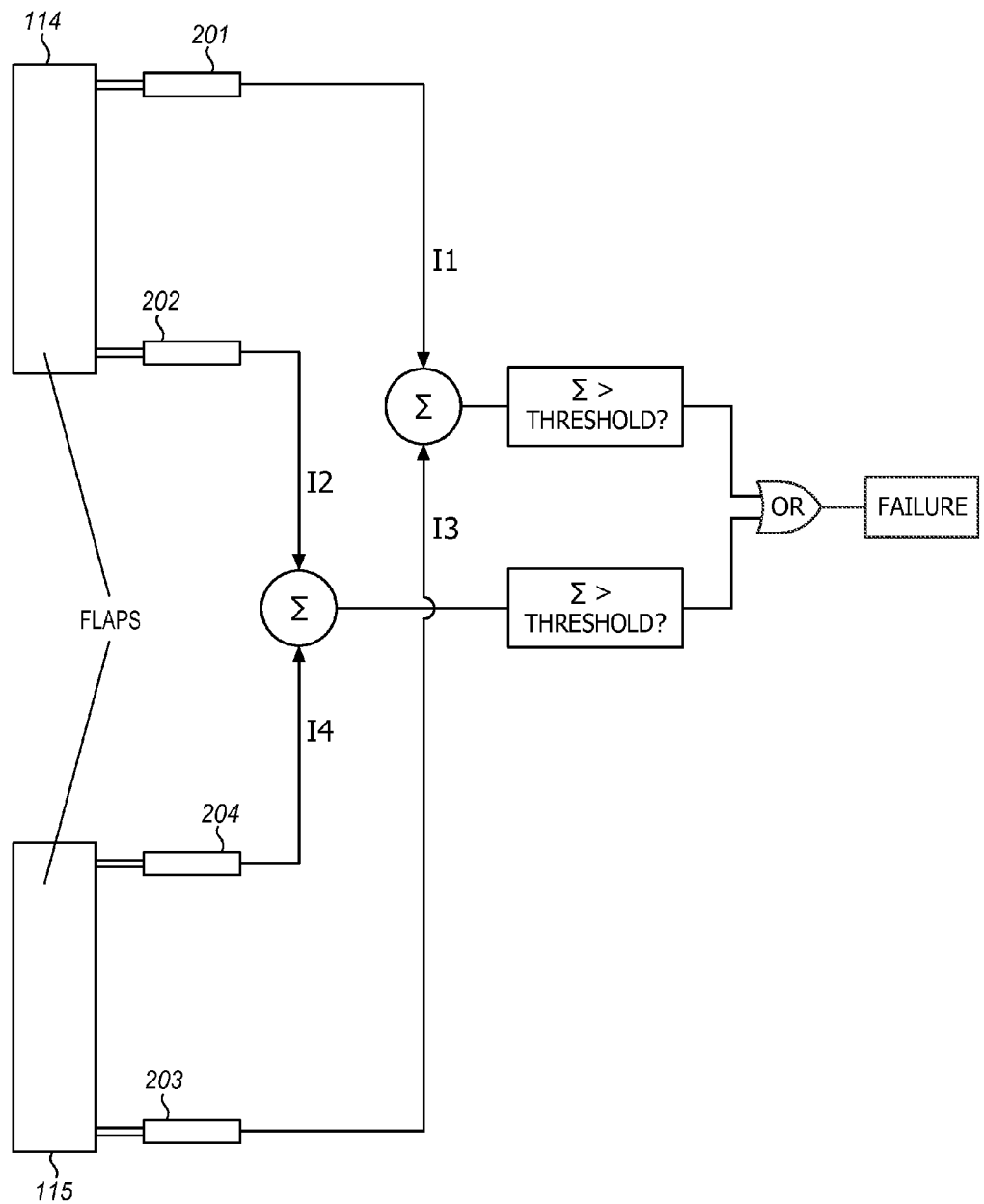
FIG. 5 is a logic diagram for detecting a freewheeling skew failure in an exemplary configuration.

FIG. 5 is a logic diagram for detecting a freewheeling skew failure in an exemplary configuration. In FIG. 5, monitor system 230 compares current draws for drive stations on opposing sides of aircraft 100. Current draw for a drive station is proportional to the load that the drive station is driving, which is the airload on a flap when the flap is extended or retracted. During normal operation with no failures, the loads on flaps 114-115 and on each of the drive stations 201-204 are symmetric about the centerline of aircraft 100. Therefore, the airload on the outboard side of flap 114 is symmetric with the airload on the outboard side of flap 115. Also, the airload on the inboard side of flap 114 is symmetric with the airload on the inboard side of flap 115. Thus, the current draw for drive station 201 should be substantially equivalent to the current draw for drive station 203, and the current draw for drive station 202 should be substantially equivalent to the current draw for drive station 204.

To detect a failure, monitor system 230 compares the current draw (I1) of drive station 201 and the current draw (I3) of the opposing drive station 203 to determine if a differential of the current draws exceeds a threshold. Monitor system 230 also compares the current draw (I2) of drive station 202 and the current draw (I4) of drive station 204 to determine if the differential of the current draws exceeds a threshold. The thresholds for the outboard side and the inboard side may be different depending on specific tolerance conditions local to the drive stations. If either of the differentials exceeds a threshold, then monitor system 230 detects a failure in high-lift system 200, and generates a failure signal.

As an example, the current draw on drive stations 201-204 will be symmetric about the centerline of aircraft 100 under normal operation, so I1=I3 and I2=I4. Assume that a mechanical malfunction occurs in drive station 201 between no-back device 320 and flap 114 (see also FIG. 3). When this malfunction occurs, motor 301 in drive station 201 will be disconnected from flap 114, and will be running at a no-load condition. With no-load on motor 301, the current draw (I1) for motor 301 will be much less than the current draw (I3) for the motor in drive station 203 (which is still holding flap 115). Therefore, the differential between I1 and I3 will be greater than the threshold, and monitor system 230 will detect a freewheeling skew failure.

Figure 6:
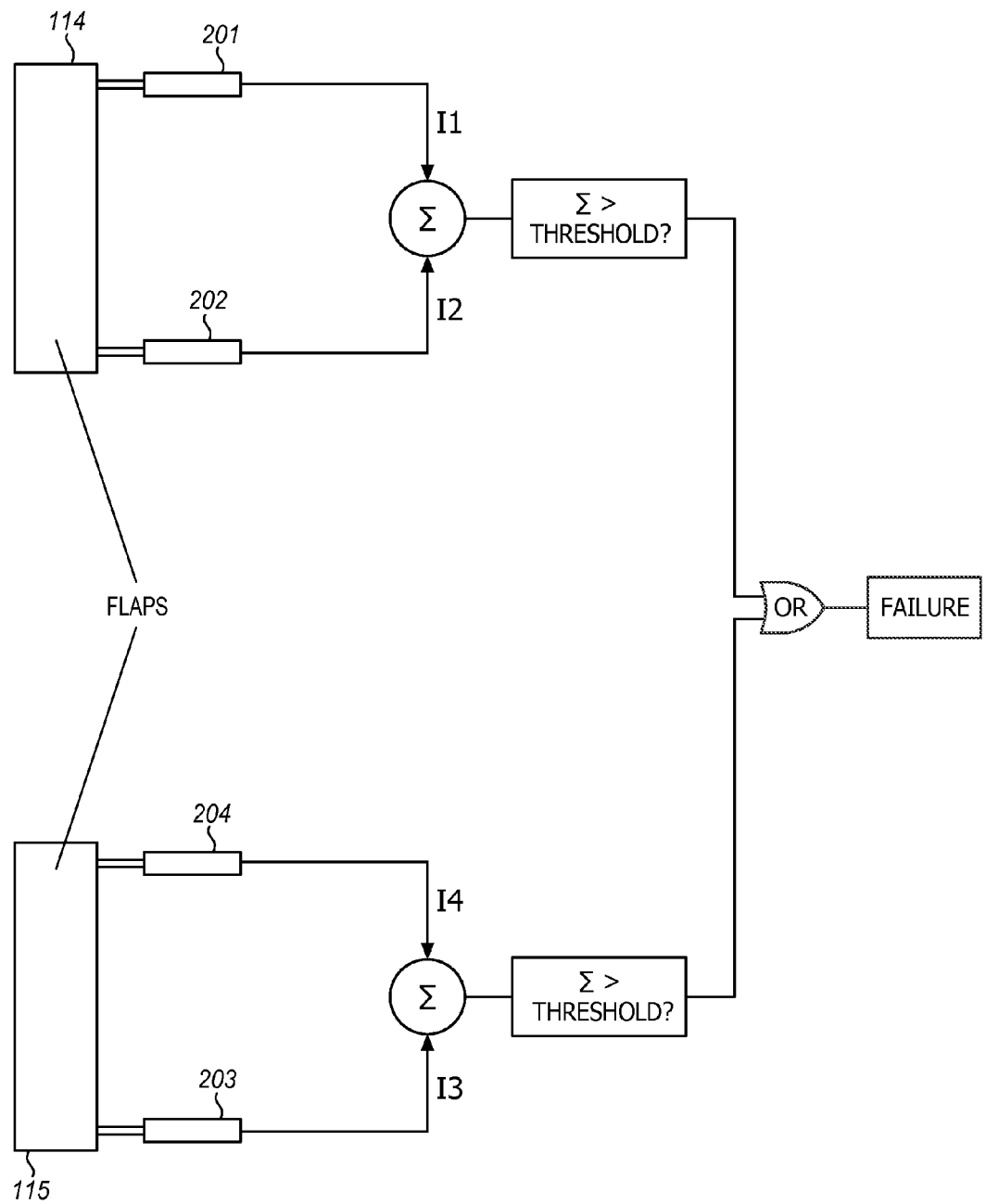
FIG. 6 is another logic diagram for detecting a freewheeling skew failure in an exemplary configuration.

FIG. 6 is another logic diagram for detecting a freewheeling skew failure in an exemplary configuration. In FIG. 6, monitor system 230 compares the current draws for drive stations on the same flap. The logic in FIG. 6 would work most effectively if the loads on each drive station on a flap were approximately the same. To detect a failure, monitor system 230 compares the current draw of drive station 201 and the current draw of drive station 202 to determine if a differential of the current draws between these two drive stations exceeds a threshold. Monitor system 230 also compares the current draw of drive station 203 and the current draw of drive station 204 to determine if a differential of the current draws between these two drive stations exceeds a threshold. The thresholds in FIG. 6 may vary as a function of airspeed of aircraft 100. If either of the differentials exceeds a threshold, then monitor system 230 detects a failure in high-lift system 200, and generates a failure signal.

As an example, assume that the current draws on drive stations 201-204 are about the same under normal conditions, so I1=I2=I3=I4. Assume also that a mechanical malfunction occurs in drive station 201 between no-back device 320 and flap 114 (see also FIG. 3). When this malfunction occurs, motor 301 in drive station 201 will be disconnected from flap 114, and will be running at a no-load condition. Under no-load, the current draw (I1) for motor 301 will be much less than the current draw (I2) for the motor in drive station 202. Therefore, the differential between I1 and I2 will be greater than the threshold, and monitor system 230 will detect a freewheeling skew failure.

Figure 7:
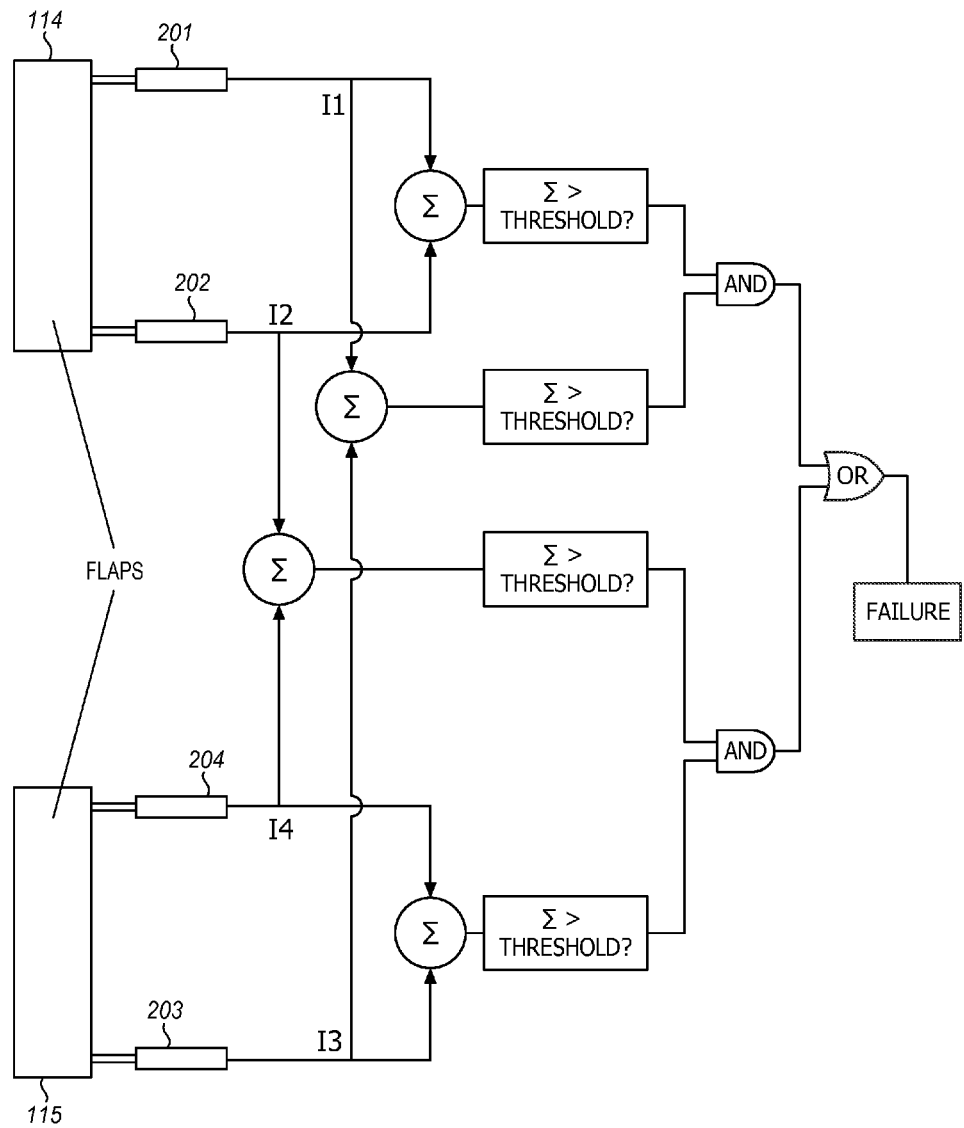
FIG. 7 is another logic diagram for detecting a freewheeling skew failure in an exemplary configuration.

FIG. 7 is another logic diagram for detecting a freewheeling skew failure in an exemplary configuration. The logic in FIG. 7 is a combination of the logic in FIGS. 5-6. Therefore, monitor system 230 compares the current draws of drive stations on opposing sides of the aircraft 100, and also compares the current draws of drive stations on the same flap to detect a failure.

Another type of failure detectable by monitor system 230 is a powered skew failure. A powered skew failure may occur when a flap is actively being extended or retracted by a drive station on only one side of the flap. This type of failure may be the result of a jam in a drive station or a failure internal to a drive station, such as a shaft failure.

Figure 8:
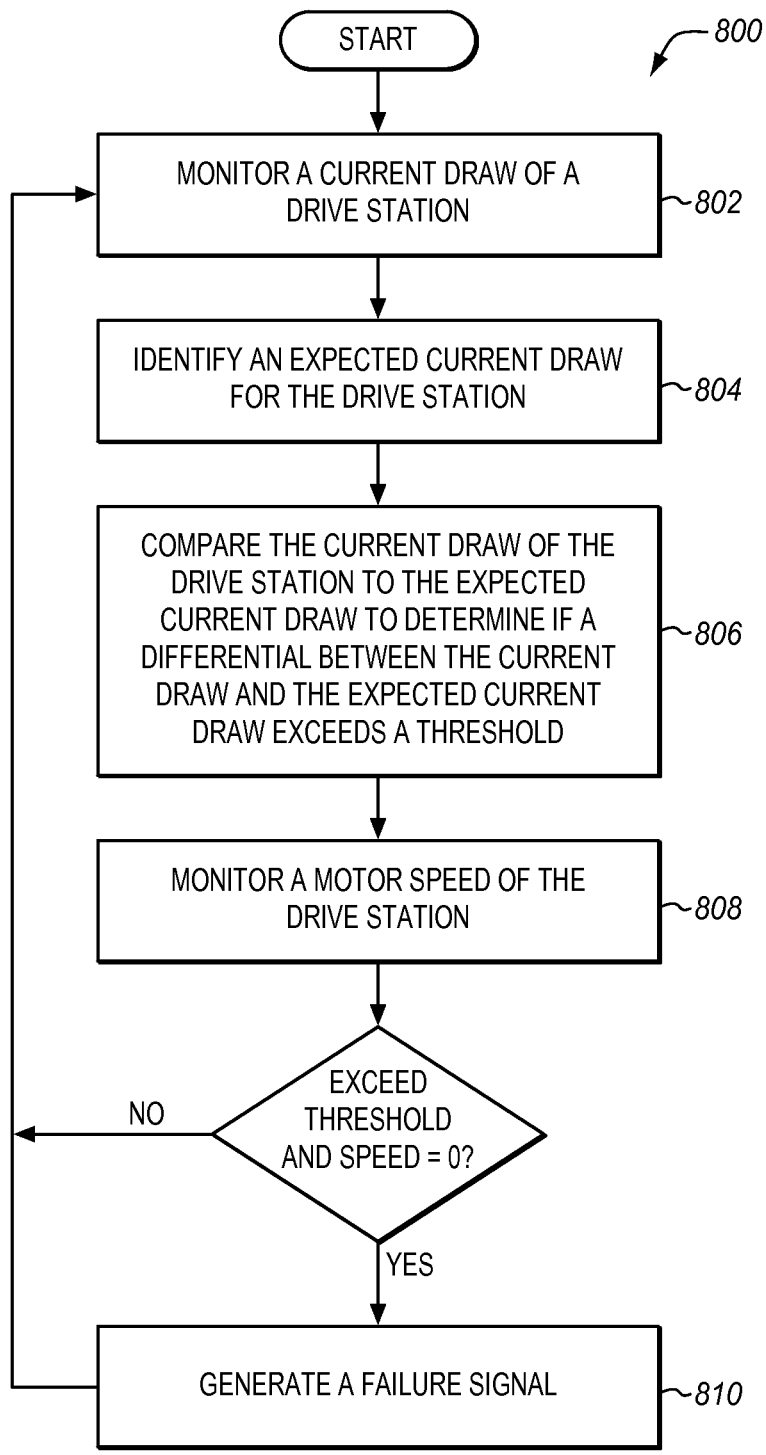
FIG. 8 is a flow chart illustrating a method of monitoring a high-lift system for a powered skew failure in an exemplary configuration.

FIG. 8 is a flow chart illustrating a method 800 of monitoring high-lift system 200 for a powered skew failure in an exemplary configuration. The steps of method 800 will be described with respect to monitor system 230 of FIG. 2, although one skilled in the art will understand that the methods described herein may be performed by other devices or systems not shown.

In step 802, monitor system 230 monitors a current draw (i.e., actual current draw) of a drive station when actuating a flap. In step 804, monitor system 230 identifies an expected current draw of the drive station when actuating a flap. The expected current draw is a typical current draw of the drive station when moving a flap under normal conditions. The expected current draw may be pre-provisioned in monitor system 230 based on historical or test data for the drive station. In step 806, monitor system 230 compares the current draw of the drive station to the expected current draw to determine if a differential between the current draws exceeds a threshold. Monitor system 230 may also monitor a motor speed of the drive station in step 808. For instance, monitor system 230 may receive a signal from motor sensor package 324 indicating a speed of motor 301 (see FIG. 3). In step 810, monitor system 230 generates a failure signal if the differential between the current draw of the drive station and the expected current draw exceeds the threshold, if the motor speed for the drive station is zero, or both.

The method in FIG. 8 allows monitor system 230 to detect a condition for a powered skew failure. When the current draw of a drive station is greater than an expected current draw and/or the motor speed for the drive station is zero, this condition indicates that a jam has occurred in the drive station. Because the drive station is jammed, the flap will only be driven by the drive station on the other side of the flap, which can cause a powered skew failure.

Figure 9:
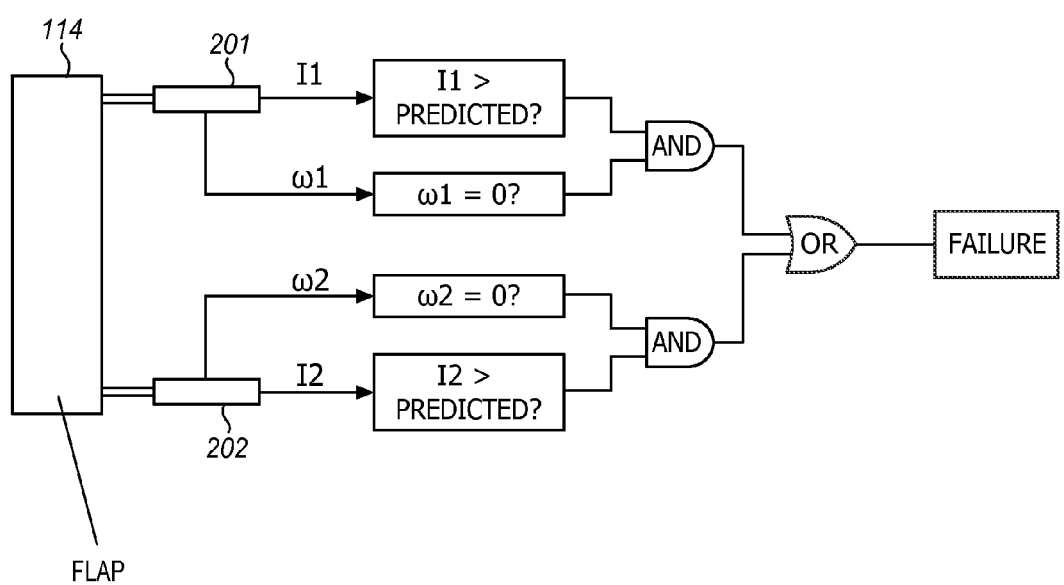
FIG. 9 is a logic diagram for detecting a powered skew failure in an exemplary configuration.

FIG. 9 is a logic diagram for detecting a powered skew failure in an exemplary configuration. Assume for FIG. 9 that monitor system 230 is monitoring drive stations 201-202 on flap 114. Monitor system 230 measures a current draw (I1) of drive station 201 for actuating flap 114, and compares a current draw of drive station 201 with an expected current draw. Monitor system 230 also determines a motor speed (ω1) of drive station 201. Monitor system 230 generates a failure signal if the actual current draw of drive station 201 is greater than the expected current draw, and the motor speed of drive station 201 is zero. When these two conditions exist, a jam has occurred in drive station 201, which may/will result in a powered skew failure. Monitor system 230 also monitors drive station 202 in a similar fashion to detect failures.

The logic in FIG. 9 allows monitor system 230 to detect a powered skew failure due to a jam in one of the drive stations 201-202. Under normal operation, the actual current draw of drive station 201 will be substantially equal to the expected current draw, and the motor speed of drive station 201 will be greater than zero because the motor 301 in drive station 201 is rotating to actuate flap 114. If a jam occurs in drive station 201, for example, the motor speed of drive station 201 will go to zero and the current draw of drive station 201 will suddenly rise. The actual current draw of drive station 201 will be greater than an expected current draw, and the motor speed of drive station 201 will be zero. Therefore, monitor system 230 is able to detect a failure.

Figure 10:
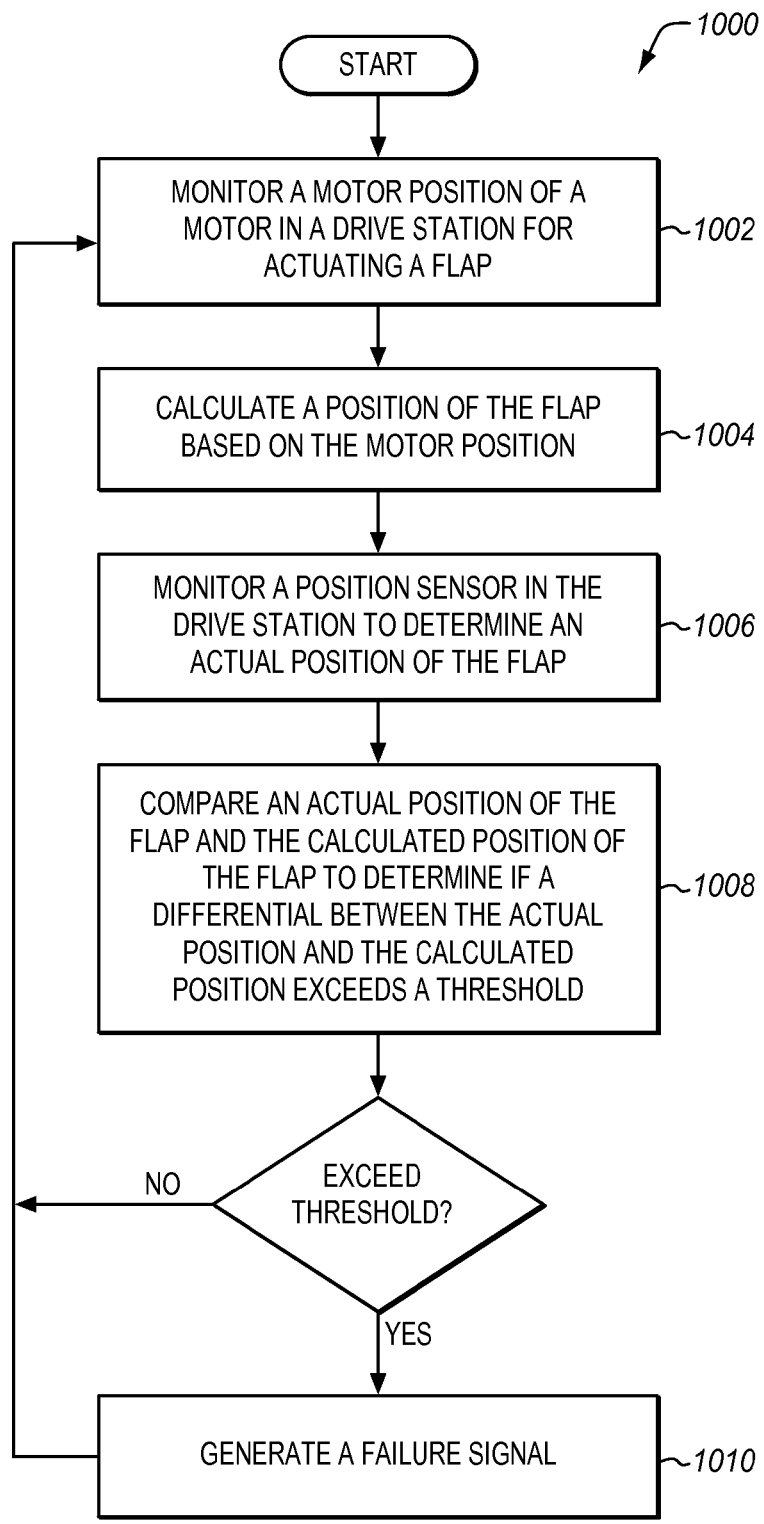
FIG. 10 is a flow chart illustrating a method of monitoring a high-lift system for a powered skew failure in an exemplary configuration.

FIG. 10 is a flow chart illustrating a method 1000 of monitoring high-lift system 200 for a powered skew failure in an exemplary configuration. The steps of method 1000 will be described with respect to monitor system 230 of FIG. 2, although one skilled in the art will understand that the methods described herein may be performed by other devices or systems not shown.

This type of powered skew is a result of a disconnect internal to the drive station as a result of a mechanical failure. If this type of failure occurs, then the motor 301 is no longer connected to connection member 310 and motor 301 can no longer extend or retract the flap (see FIG. 3). The presence of no-back device 320 will prevent drive screw 303 from rotating due to loads from the flap.

In step 1002 of method 1000, monitor system 230 monitors a motor position of a motor in a drive station for actuating a flap. For instance, monitor system 230 may receive a signal from motor sensor package 324 indicating a position of motor 301 (see FIG. 3). In step 1004, monitor system 230 calculates or estimates a position of the flap or connection member 310 based on the motor position. Looking at FIG. 3, there is a relationship between the position of motor 301 and the position of connection member 310 for the flap. The motor and motor sensors are mechanically connected by the gear reduction to connection member 310. Therefore, monitor system 230 can estimate the output position of connection member 310 and/or the flap based on the position of motor 301 at any given time.

In step 1006, monitor system 230 monitors position sensor 322 in the drive station to determine an actual position of the flap (see FIG. 3). Although position sensor 322 is integrated within a drive station, it is able to determine the output position of connection member 310 and/or the flap. In step 1008, monitor system 230 compares an actual position of the flap and the estimated position of the flap to determine if a differential between the actual position and the estimated position exceeds a threshold. In step 1010, monitor system 230 generates a failure signal if the differential exceeds the threshold.

The method in FIG. 10 allows monitor system 230 to detect a condition for a powered skew failure. When the actual position of the flap differs from a calculated position of the flap (based on the motor position), this condition indicates that the drive station has incurred an internal failure resulting from a mechanical disconnect. Because no-back device 320 is holding the failed drive station's position, the flap will be driven by the drive station on the other side of the flap, which can cause a powered skew failure.

Figure 11:
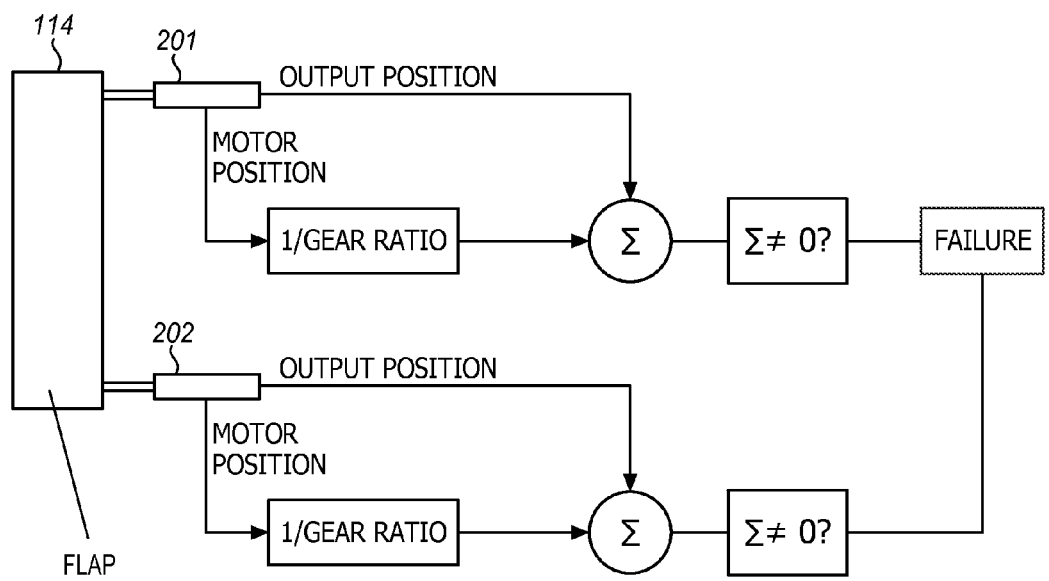
FIG. 11 is a logic diagram for detecting a powered skew failure in an exemplary configuration.

FIG. 11 is a logic diagram for detecting a powered skew failure in an exemplary configuration. Assume again for FIG. 11 that monitor system 230 is monitoring drive stations 201-202 on flap 114 for a powered skew failure. Monitor system 230 monitors a motor position of motor 301 in drive station 201 when actuating flap 114. Because motor 301 moves flap 114 through gear train 302, monitor system 230 calculates the position of flap 114 based on the motor position and the gear ratio of gear train 302. Monitor system 230 also monitors position sensor 322 in drive station 201 to determine an actual position of connection member 310 or flap 114. Monitor system 230 compares the actual position of flap 114 based on position sensor 322 with an estimated position of flap 114 based on the motor position to determine a differential. If the differential between the actual position of flap 114 and the calculated position of flap 114 exceeds a threshold, then monitor system 230 generates a failure signal. Monitor system 230 also monitors drive station 202 in a similar fashion to detect a failure. While not shown in FIG. 10 or FIG. 11, the current can be monitored in addition to the motor position and output position to corroborate the failure state. In this case, the current draw from drive station 201 can be compared to the current draw from drive station 203.

The monitoring processes described above advantageously determine failures of high-lift system 200. The processes are able to monitor high-lift system 200 using sensors that are integrated into the drive stations. Thus, there is no need to install sensors on the flaps themselves to monitor for failures. However, if there are sensors installed on the flaps for other reasons, these could be used to confirm the failures or check for sensor failures.

Any of the various elements shown in the figures or described herein may be implemented as hardware, software, firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, an element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific configurations were described herein, the scope is not limited to those specific configurations. Rather, the scope is defined by the following claims and any equivalents thereof.

The invention claimed is:

1. A method of monitoring a high-lift system on an aircraft having a first drive station installed on a first side of a flap and a second drive station installed on a second side of the flap, the method comprising:
monitoring, at a controller of the high-lift system, a first current draw of a first electric motor in the first drive station for actuating the flap;
identifying, at the controller, an expected current draw of the first drive station;
comparing, at the controller, the first current draw of the first drive station to the expected current draw of the first drive station to determine if a differential between the first current draw and the expected current draw of the first drive station exceeds a first threshold; and
generating a failure signal in the controller if the differential between the first current draw and the expected current draw of the first drive station exceeds the first threshold to indicate a failure in the high-lift system.

2. The method of claim 1 further comprising:
monitoring a motor speed of the first electric motor in the first drive station; and
generating the failure signal when the differential between the first current draw and the expected current draw of the first drive station exceeds the first threshold, and when the motor speed of the first electric motor is zero.

3. The method of claim 2 further comprising:
monitoring a second current draw of a second electric motor in the second drive station for actuating the flap;
identifying an expected current draw of the second drive station;
comparing the second current draw of the second drive station to the expected current draw of the second drive station to determine if a differential between the second current draw and the expected current draw of the second drive station exceeds a second threshold; and
generating the failure signal if the differential between the second current draw and the expected current draw of the second drive station exceeds the second threshold.

4. The method of claim 3 further comprising:
monitoring a motor speed of the second electric motor in the second drive station; and
generating the failure signal when the differential between the second current draw and the expected current draw of the second drive station exceeds the second threshold, and when the motor speed of the second electric motor is zero.

5. The method of claim 1 wherein:
the expected current draw of the first drive station is pre-provisioned based on historical data for the first drive station.

6. The method of claim 1 wherein:
the expected current draw of the first drive station is pre-provisioned based on test data for the first drive station.

7. The method of claim 1 wherein generating the failure signal comprises:
generating the failure signal indicating a powered skew failure when the first current draw of the first drive station is greater than the expected current draw of the first drive station by the first threshold.

8. The method of claim 1 wherein generating the failure signal comprises:
generating the failure signal indicating a powered skew failure when the first current draw of the first drive station is greater than the expected current draw of the first drive station by the first threshold, and a motor speed of the first electric motor in the first drive station is zero.

9. A high-lift system on an aircraft, the high-lift system comprising:
a first drive station installed on a first side of a flap and having a first electric motor to impart movement on the first side of the flap;
a second drive station installed on a second side of the flap and having a second electric motor to impart movement on the second side of the flap; and
a controller configured to monitor a first current draw of the first electric motor, to identify an expected current draw of the first drive station, to compare the first current draw of the first drive station to the expected current draw of the first drive station to determine if a differential between the first current draw and the expected current draw of the first drive station exceeds a first threshold, and to generate a failure signal if the differential between the first current draw and the expected current draw of the first drive station exceeds the first threshold to indicate a failure in the high-lift system.

10. The high-lift system of claim 9 wherein:
the controller is configured to monitor a motor speed of the first electric motor in the first drive station, and to generate the failure signal when the differential between the first current draw and the expected current draw of the first drive station exceeds the first threshold, and when the motor speed of the first electric motor is zero.

11. The high-lift system of claim 10 wherein:
the controller is configured to monitor a second current draw of the second electric motor in the second drive station, to identify an expected current draw of the second drive station, to compare the second current draw of the second drive station to the expected current draw of the second drive station to determine if a differential between the second current draw and the expected current draw of the second drive station exceeds a second threshold, and to generate the failure signal if the differential between the second current draw and the expected current draw of the second drive station exceeds the second threshold.

12. The high-lift system of claim 11 wherein:
the controller is configured to monitor a motor speed of the second electric motor in the second drive station, and to generate the failure signal when the differential between the second current draw and the expected current draw of the second drive station exceeds the second threshold, and when the motor speed of the second electric motor is zero.

13. The high-lift system of claim 9 wherein:
the expected current draw of the first drive station is pre-provisioned based on historical data for the first drive station.

14. The high-lift system of claim 9 wherein:
the expected current draw of the first drive station is pre-provisioned based on test data for the first drive station.

15. The high-lift system of claim 9 wherein:
the controller is configured to generate the failure signal indicating a powered skew failure when the first current draw of the first drive station is greater than the expected current draw of the first drive station by the first threshold.

16. The high-lift system of claim 9 wherein:
the controller is configured to generate the failure signal indicating a powered skew failure when the first current draw of the first drive station is greater than the expected current draw of the first drive station by the first threshold, and a motor speed of the first electric motor in the first drive station is zero.

17. A method of monitoring a high-lift system of an aircraft, the method comprising:
monitoring, at a controller of the high-lift system, a motor position of a motor in a drive station for actuating a flap;
calculating, at the controller, a position of the flap based on the motor position;
monitoring, at the controller, a position sensor in the drive station to determine an actual position of the flap;
comparing, at the controller, the actual position of the flap and the calculated position of the flap to determine if a differential between the actual position and the calculated position exceeds a threshold; and
generating a failure signal in the controller if the differential exceeds the threshold to indicate a failure in the high-lift system.

18. The method of claim 17 wherein calculating the position of the flap based on the motor position comprises:
calculating the position of the flap based on the motor position and based on a gear ratio for a gear train that is connected between the motor and the flap.

19. The method of claim 17 wherein:
the position sensor is integral with the drive station, and is mounted between a no-back device and the flap.

20. The method of claim 17 wherein generating the failure signal comprises:
generating the failure signal indicating a mechanical disconnect between the motor and the flap when the differential between the actual position of the flap and the calculated position of the flap exceeds the threshold.

* * * * *